United States Patent [19]

Lee

[11] Patent Number: 5,561,387
[45] Date of Patent: Oct. 1, 1996

[54] METHOD FOR MEASURING GATE INSULATION LAYER THICKNESS

[75] Inventor: Jian-Hsing Lee, Hsin-Chu, Taiwan

[73] Assignee: Taiwan Semiconductor Manufacturing Company Ltd, Hsinchu, Taiwan

[21] Appl. No.: 507,532

[22] Filed: Jul. 26, 1995

[51] Int. Cl.[6] .................................................. G01R 31/22
[52] U.S. Cl. ........................................ 324/765; 324/769
[58] Field of Search ............................. 324/765, 770, 324/769, 768, 158.1, 73.1; 257/318, 322, 40, 48; 365/185, 104; 437/8

[56] References Cited

U.S. PATENT DOCUMENTS

| | | | |
|---|---|---|---|
| 3,919,711 | 11/1975 | Chou | 257/318 |
| 4,257,056 | 3/1981 | Shum | 365/185 |
| 4,382,229 | 5/1983 | Cottrell et al. | 324/765 |
| 4,503,519 | 3/1985 | Arakawa | 365/104 |
| 5,412,608 | 5/1995 | Oyama | 365/185 |

*Primary Examiner*—Vinh P. Nguyen
*Attorney, Agent, or Firm*—George O. Saile

[57] ABSTRACT

The thickness of the gate insulation layer in an FET has been measured by relating it to its Fowler-Nordheim tunneling field. This Fowler-Nordheim tunneling field is measured in-situ and is non-destructive. Details of the method and apparatus are given.

15 Claims, 7 Drawing Sheets

METHOD FOR MEASURING GATE INSULATION LAYER THICKNESS

BACKGROUND OF THE INVENTION

(1) FIELD OF THE INVENTION

The invention relates to the general field of integrated circuits, more particularly to field effect transistors and measurements performed thereon.

(2) DESCRIPTION OF THE PRIOR ART

Field Effect Transistors (FETs), in their simplest form, comprise a body of semiconducting material, usually silicon, having two regions of opposite conductivity type to its own, embedded within it and spaced a short distance apart. Said regions of opposite conductivity type are referred to as source and drain regions, the region between them being referred to as the gate region. In most FET designs the gate region further comprises a thin layer of insulating material on the semiconductor surface (usually its oxide) covered with a layer of a contact material (often polycrystalline silicon). Electrically separate electrodes contact all three regions.

Normally, when voltage is applied between source and drain, very little current flows since one of the two PN junctions (relative to the silicon body) will always be back biassed. When, however, the positive voltage becomes large enough it will generate a gate tunneling current. This tunneling current will flow into the depletion region where it acts as an impact ionization source to drive its parasitic bipolar on and go into snap lock (a sharp drop in voltage).

In FIG. 1 we show a schematic cross-section of a type of FET known as an LDD (lightly doped drain). Silicon substrate 1 is P type so that source and drain regions 2 and 3 are N type. Gate insulation layer 4 is contacted through gate electrode 8. Oxide spacers 5 are disposed on either side of gate electrode 10.

Extending from the edges of regions 2 and 3, and lying directly below the spacers, are shallow, lightly doped N regions 6 that define the width of the gate channel. Regions 6 are there for the purpose of improving the performance characteristics of the FET. In a commonly used configuration, source 2 is contacted through grounded electrode 7. The incoming signal that is to be amplified is applied to electrode 8 and the amplified signal read at drain electrode 9.

Most of the FETs of the type just described are mass produced as components within integrated circuits. As a normal part of manufacturing it is necessary, from time to time, to perform measurements on individual FETs, including some of their internal parts. This could be for the purpose of quality control, process control, or trouble shooting, to name a few possibilities. One such measurement is the thickness of the gate insulation layer (4 in FIG. 1).

Thin insulating layers of the type that form gate insulation layers in an FET are most commonly measured by one of several types of non-destructive optical methods, such as ellipsometry or interferometry. These methods all require that at least one surface of the layer being measured be uncovered so they are only applicable prior to the formation of the gate electrode (10 in FIG. 1). This is a severe limitation when used as part of a manufacturing process.

Another possible method for determining gate insulation layer thickness is through a capacitance measurement. This method does not involve removal of the gate electrode but does require a precise value for the area of the gate electrode (assuming, reasonably, that the dielectric constant of the insulating layer is known). In practice, determination of the area to any degree of precision, would be either very time consuming or impossible.

SUMMARY OF THE INVENTION

It is an object of the present invention to provide a non-destructive method for measuring the thickness of the gate insulation layer in an FET.

A further object is that said non-destructive method not be dependent on additional measurements of other quantities.

Yet another object of the present invention is to provide a non-destructive method for measuring the thickness of the gate insulation layer in an FET that can be performed in-situ as part of a manufacturing process.

Still another object of the present invention is to provide an apparatus for the implementation of the aforementioned method.

These objects have been achieved by relating the Fowler-Nordheim tunneling field of the gate insulation layer to its thickness. The Fowler-Nordheim tunneling field is measured in-situ and is non-destructive. Details of the method and apparatus are given below.

DESCRIPTION OF THE PREFERRED EMBODIMENTS

Figure 4:
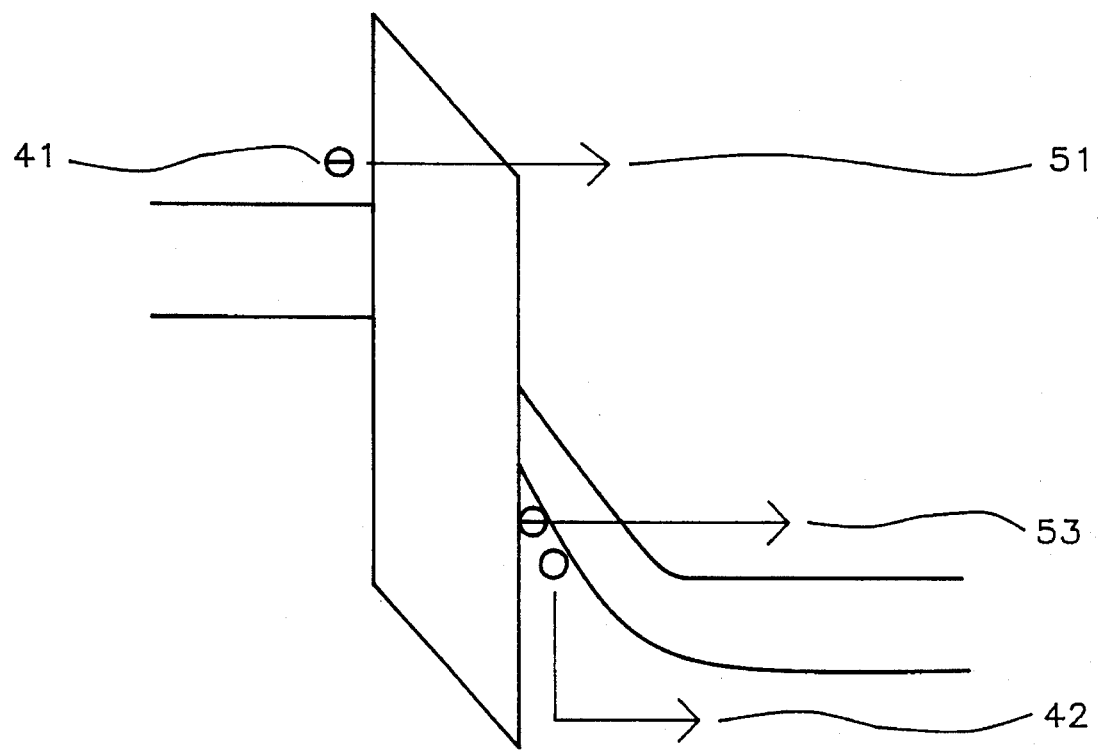
FIG. 4 shows how the tunneling current results from the bending of the energy bands at the silicon to silicon oxide interface.
Figure 5:
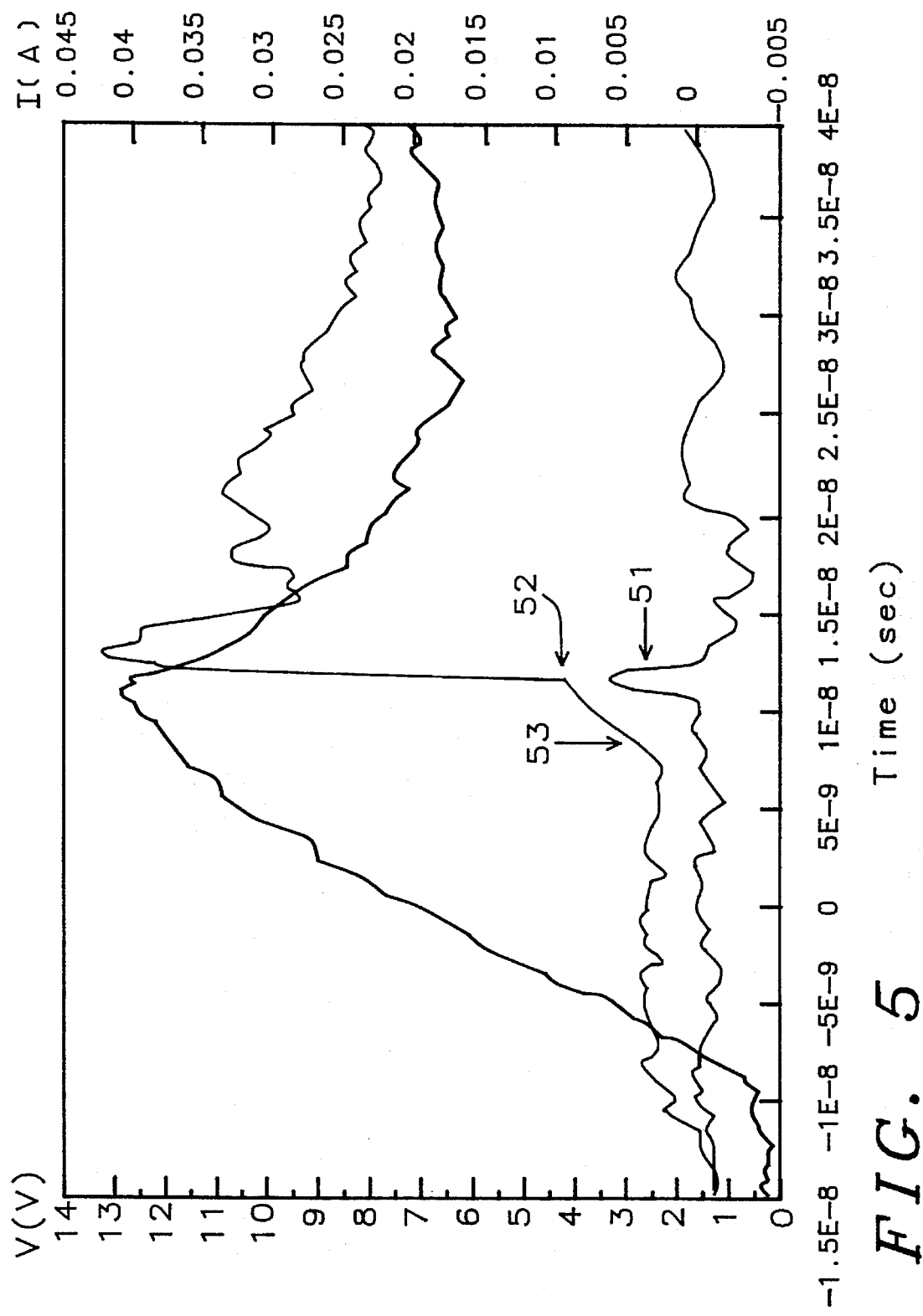
FIG. 5 shows the drain voltage, drain current, and gate current as a function of time.

When the electric field is high enough, band-to-band (BB) tunneling occurs in the gate-overlapped, deep-depleted drain region. The basic mechanism through which this occurs is illustrated by the energy band diagram in FIG. 4 (with BB designated as 53) while the actual current-voltage curve is shown in FIG. 5. At still higher fields, (approximately $10^7$ volts/cm.) Fowler-Nordheim (FN) tunneling 51 begins. This is also illustrated by the energy band diagram 41 in FIG. 4 and the actual current-voltage curve is also shown in FIG. 5.

The combined BB and FN tunneling currents flow into the depletion region of the drain and generate holes through impact ionization. This is illustrated in FIG. 4. These holes flow through the P-substrate and cause the source to become forward biassed. As a result, the source injects electrons 42 into the drain region and turns on the bipolar, thereby going into snapback, as discussed earlier. See, for example, 52 in FIG. 5 (drain voltage vs. time).

The FN tunneling field can be related to the layer thickness, as follows:

$$E_{FN} = V_m/d_i \quad \text{where } E_{FN} \text{ is the breakdown field,} \quad (1)$$
$$V_m \text{ is the max. voltage and } d_i \text{ is the thickness of the insulating layer.}$$

$$\therefore d_i = V_m/E_{FN} \quad (2)$$
$$= V_m/10^7 \text{ cm.} = V_m \times 10 \text{ Angstroms (breakdown field for silicon dioxide is } 10^7 \text{ volts/cm.)}$$

Thus, a relationship can be seen to exist between the thickness of the insulating layer and the maximum voltage, namely thickness in Angstroms=10× maximum voltage in volts.

Figure 1:
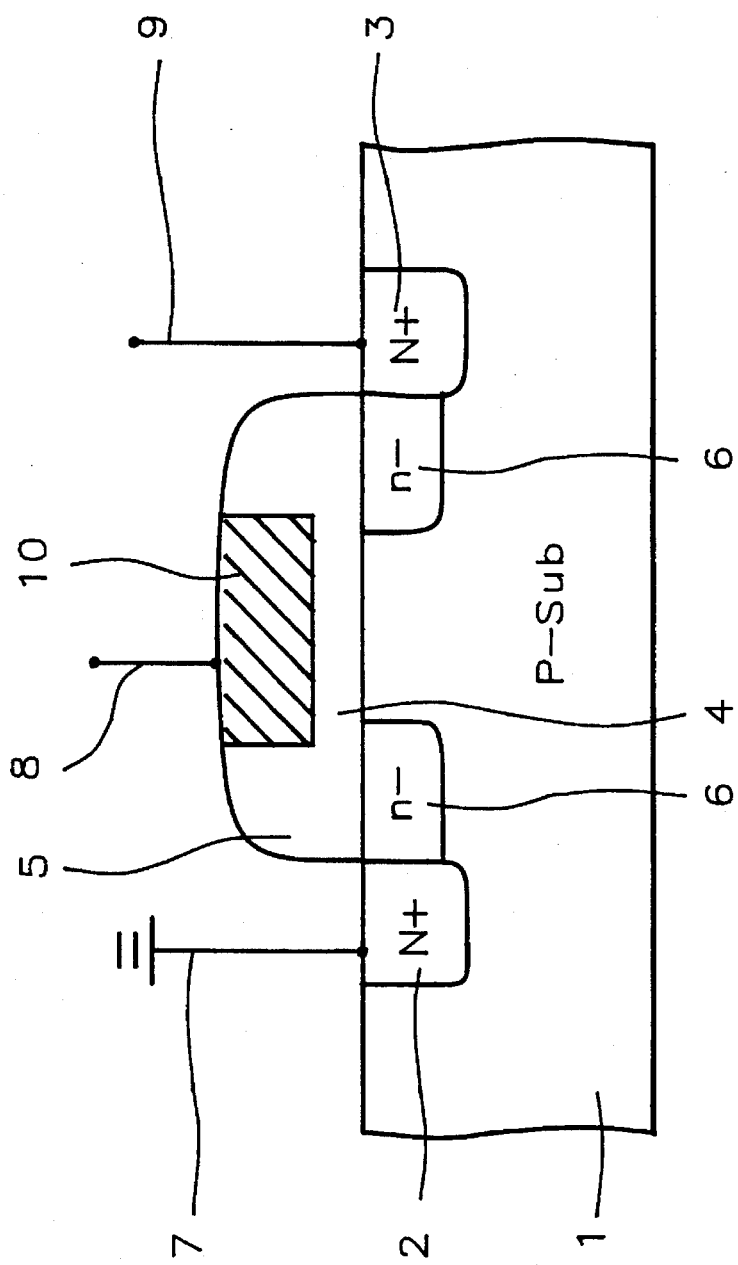
FIG. 1 shows a cross-section of a typical FET whose gate insulation layer thickness is to be measured.
Figure 2:
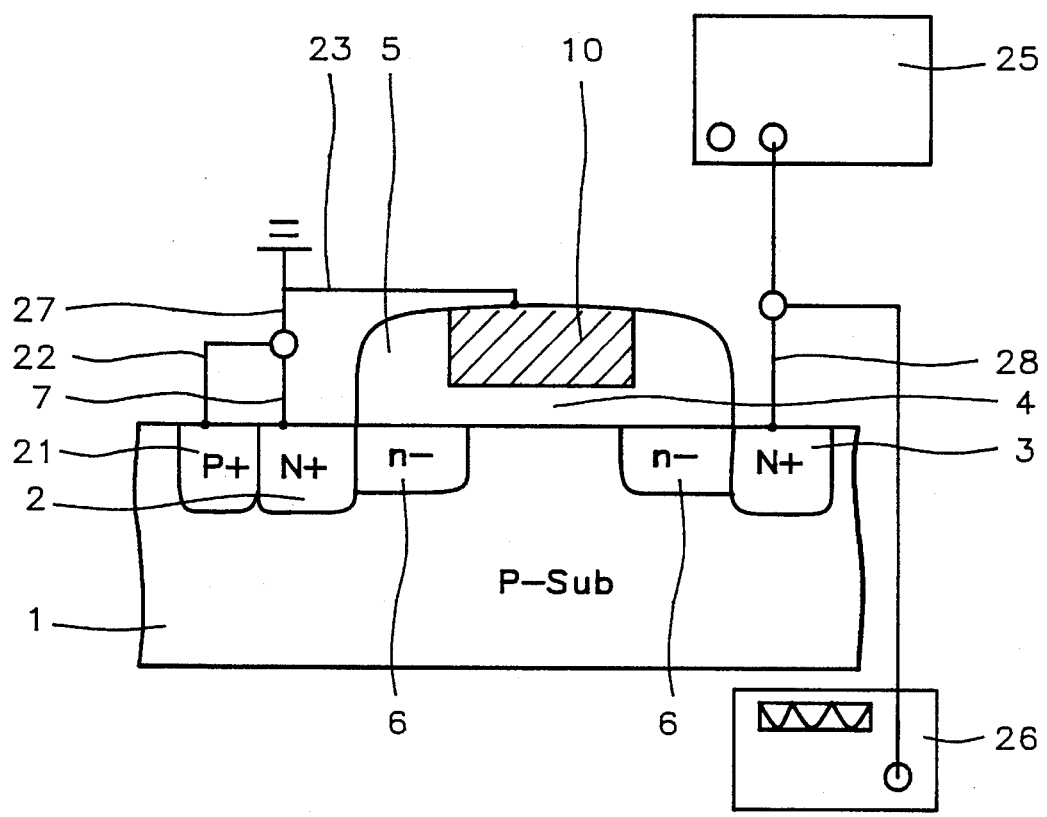
FIG. 2 illustrates the circuitry and components needed for the implementation of the invention.
Figure 3:
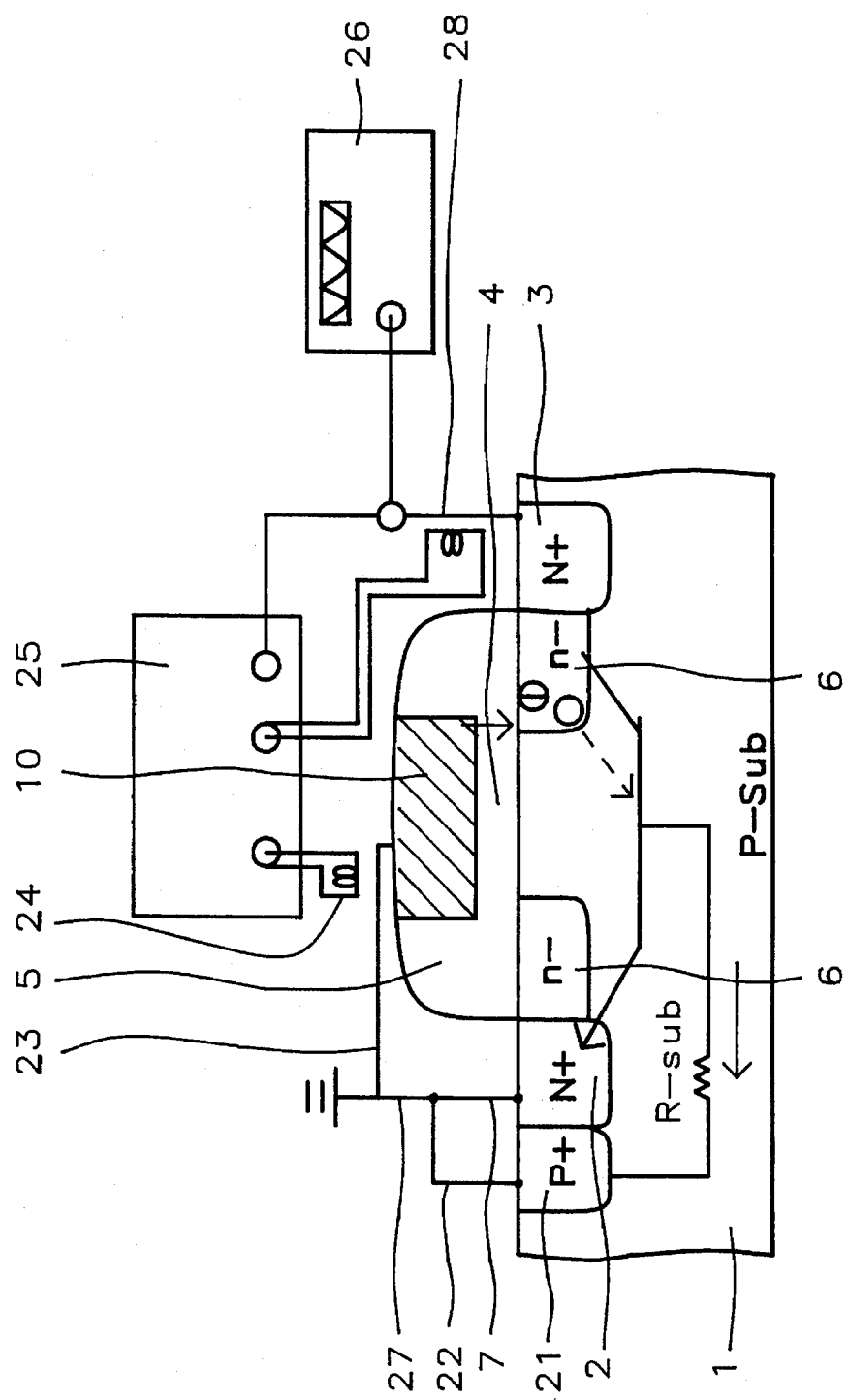
FIG. 3 shows the apparatus used to study the mechanism of the present invention.

Referring now to FIG. 2, we show the apparatus used to measure $V_m$, and hence $d_i$. The FET is as was shown in FIG. 1 except that P+region 21 has been added to allow ohmic contact to be made to the substrate through contact 22. Gate electrode 10 is grounded through contact 23. Voltage across gate insulation layer 4 is applied through drain contact 28 from function generator 26. The voltage dropped across layer 4 is observed and measured through oscilloscope 25.

Once all the connections have been made, function generator 26 generates a voltage that rises steadily with time. As the applied voltage rises, the FN tunneling field is exceeded and the combination of the BB and FN tunneling currents act as a trigger source to drive its parasitic bipolar on and then go into snap-back which is reflected as a sudden steep drop in the voltage/time curve displayed by the oscilloscope.

A key feature of the present invention is that the time during which gate current due to FN tunneling is actually flowing is kept short enough so that no degradation of the oxide layer occurs. The time during which voltage from the signal generator is applied across gate insulation layer 4 is less than 2 nanoseconds, as shown in FIG. 5.

Figure 6:
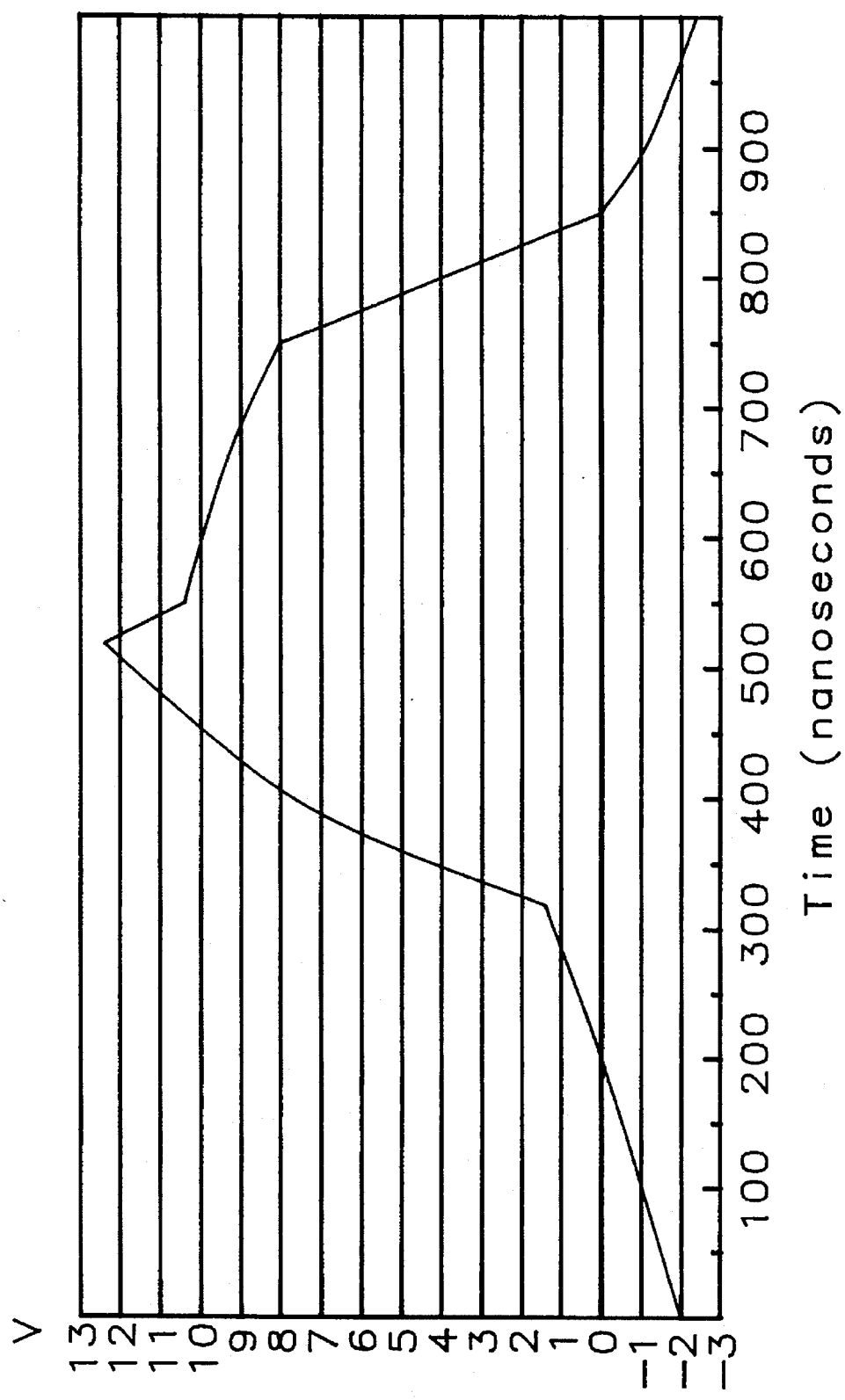
FIGS. 6 and 7 are examples of actual thickness measurements made in accordance with the invention.
Figure 7:
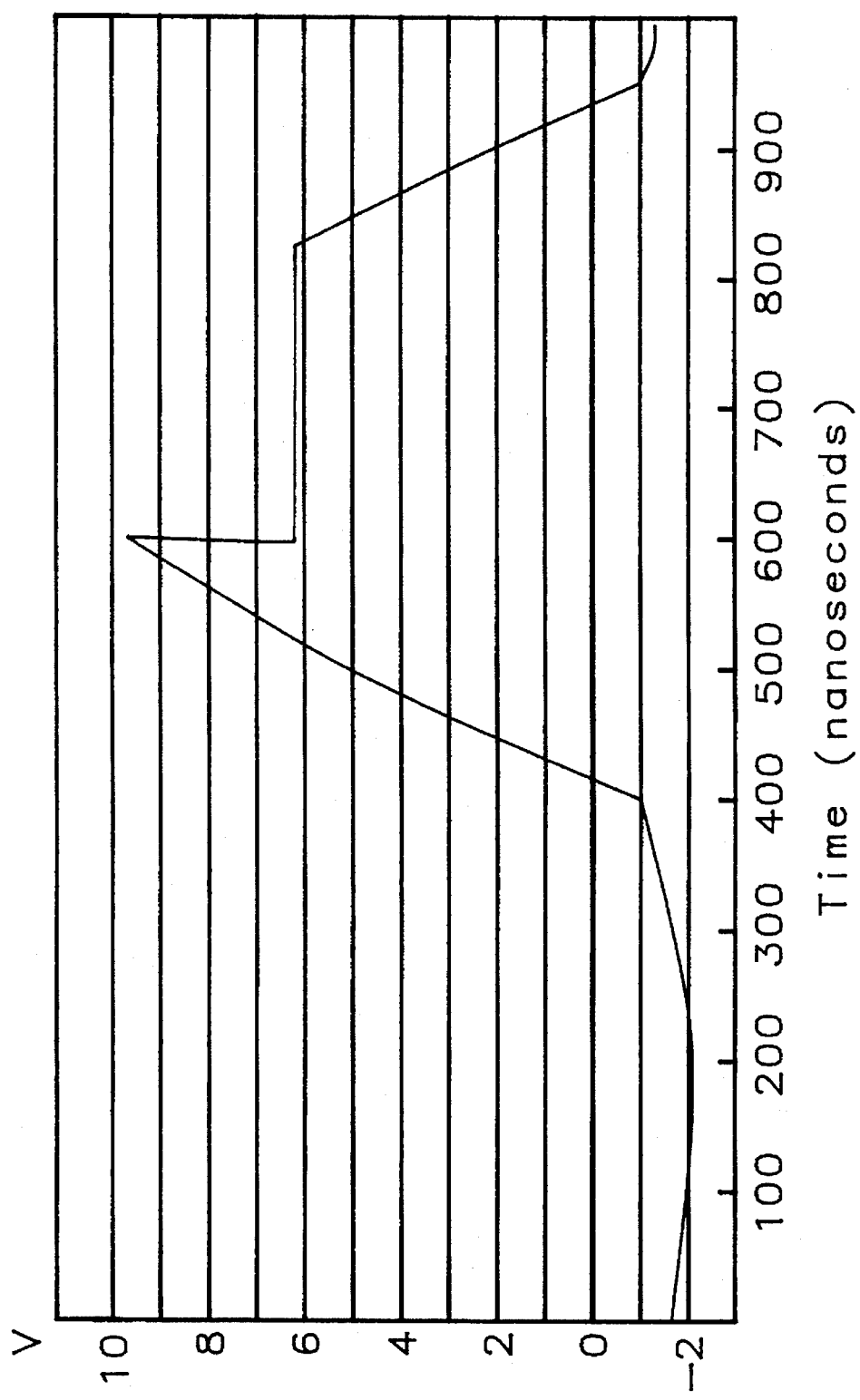

FIGS. 6 and 7 are two examples of the application of the present invention to measurements on actual product. The voltage peaks can be seen to be at 12.5 volts in FIG. 5 and at 9.7 volts for FIG. 6, corresponding to thicknesses of 125 and 97 Angstrom units respectively, in accordance with equation (2) above. Note that the rate at which voltage is increased is 1,000 times faster in FIG. 5 than it is in FIG. 6. This serves to illustrate that the snap-back voltage is not dependent on the rate at which voltage is applied (at least to the limits specified earlier). The method is applicable for measuring gate insulation layer thicknesses for any NMOS device in which FN tunneling occurs before junction breakdown. Although our normal application of the invention is to LDD silicon FETs whose gate insulation layers comprise silicon oxide, the invention could be applied to other FETs such as non-LDD types or FETs of gallium arsenide.

Thus, while the invention has been particularly shown and described with reference to the preferred embodiments thereof, it will be understood by those skilled in the art that various changes in form and details may be made without departing from the spirit and scope of the invention.

What is claimed is:

1. A method for measuring gate insulation layer thickness in a Field Effect Transistor comprising:

providing a Field Effect Transistor having contactable source, gate and drain electrodes;

providing a voltage supply having two terminals;

connecting one of said terminals to said gate electrode and the other terminal to said drain electrode;

causing said voltage supply to output a voltage that increases with time until it is sufficient to cause band-to-band and Fowler-Nordheim tunneling;

measuring the maximum voltage between said gate electrode and said drain electrode during the time that said voltage output was increased; and then multiplying said maximum voltage by ten thereby obtaining a value, in Angstrom units, for said gate insulation layer thickness.

2. The method of claim 1 wherein said Field Effect Transistor comprises silicon and said gate insulation layer comprises silicon oxide.

3. The method of claim 2 wherein said gate electrode comprises polycrystalline silicon.

4. The method of claim 1 wherein the characteristics of said Field Effect Transistor are such that Fowler-Nordheim tunneling occurs before any of its PN junctions break down.

5. The method of claim 1 wherein the time during which voltage is applied is less than about two nanoseconds.

6. The method of claim 1 wherein a maximum amount of current that flows is limited to that due to Fowler-Nordheim tunneling.

7. The method of claim 1 wherein said Field Effect Transistor is an N channel device.

8. The method of claim 1 wherein said Field Effect Transistor is a P channel device.

9. The method of claim 1 wherein said Field Effect Transistor comprises gallium arsenide.

10. An apparatus for measuring gate insulation layer thickness in a Field Effect Transistor comprising:

a Field Effect Transistor having source, gate, and drain electrodes;

a source of voltage connected to said gate and said drain electrodes;

means for increasing said voltage over time until Fowler-Nordheim tunneling has occurred within said gate insulation layer; and means for measuring the maximum voltage between said gate electrode and said drain electrode during the time that said voltage output was increased wherein said maximum voltage is multiplied by 10 thereby obtaining a value, in Angstrom units, for said gate insulation layer thickness.

11. The apparatus of claim 10 wherein said means for increasing said voltage over time comprises a function generator.

12. The apparatus of claim 10 wherein said means for measuring the maximum voltage between said gate electrode and said drain electrode comprises an oscilloscope.

13. The apparatus of claim 10 wherein said Field Effect Transistor comprises silicon and said gate insulation layer comprises silicon oxide.

14. The apparatus of claim 10 wherein said Field Effect Transistor is an N channel device.

15. The apparatus of claim 10 wherein said Field Effect Transistor comprises gallium arsenide.

* * * * *